(12) United States Patent
Amikura et al.

(10) Patent No.: US 7,931,749 B2
(45) Date of Patent: Apr. 26, 2011

(54) SHOWER HEAD AND FILM-FORMING DEVICE USING THE SAME

(75) Inventors: Manabu Amikura, Nirasaki (JP); Teruo Iwata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 991 days.

(21) Appl. No.: 10/574,531

(22) PCT Filed: Oct. 22, 2004

(86) PCT No.: PCT/JP2004/015716
§ 371 (c)(1),
(2), (4) Date: May 25, 2007

(87) PCT Pub. No.: WO2005/041285
PCT Pub. Date: May 6, 2005

(65) Prior Publication Data
US 2007/0272154 A1    Nov. 29, 2007

(30) Foreign Application Priority Data

Oct. 23, 2003  (JP) .................................. 2003-363448

(51) Int. Cl.
*C23C 10/00*    (2006.01)
*C23C 16/455*   (2006.01)

(52) U.S. Cl. ............... 118/715; 156/345.33; 156/345.34

(58) Field of Classification Search .................. 118/715; 156/345.33, 345.34
See application file for complete search history.

(56) References Cited

U.S. PATENT DOCUMENTS

| | | | | |
|---|---|---|---|---|
| 3,526,658 A | * | 9/1970 | Bryant, Jr ..................... | 562/485 |
| 5,595,606 A | * | 1/1997 | Fujikawa et al. ............. | 118/725 |
| 5,624,498 A | * | 4/1997 | Lee et al. ...................... | 118/715 |
| 6,086,677 A | * | 7/2000 | Umotoy et al. ............... | 118/715 |
| 6,126,753 A | * | 10/2000 | Shinriki et al. ............... | 118/715 |
| 6,148,761 A | * | 11/2000 | Majewski et al. ............. | 118/715 |
| 6,302,964 B1 | * | 10/2001 | Umotoy et al. ............... | 118/715 |

(Continued)

FOREIGN PATENT DOCUMENTS

JP    57-037821    3/1982

(Continued)

OTHER PUBLICATIONS

Notification of Transmittal of Translation of the International Preliminary Report on Patentability (Form PCT/IB/338), in connection with PCT/JP2004/015716, dated Jan. 2004.

(Continued)

*Primary Examiner* — Jeffrie R Lund
(74) *Attorney, Agent, or Firm* — Smith, Gambrell & Russell, LLP (57) ABSTRACT

The present invention relates to a showerhead that supplies a source gas and a supporting gas for depositing a film into a processing vessel of a film deposition apparatus. The showerhead includes a body which is provided with a gas jetting surface (8). In the showerhead body, there are defined a first diffusion chamber (60) that receives the source gas and diffuses the same, and a second diffusion chamber (62) that receives the supporting gas and diffuses the same. The gas jetting surface has source-gas jetting orifices (10A) that are in communication with the first diffusion chamber, and first supporting-gas jetting orifices (10B) that are in communication with the second diffusion chamber. Each of the first supporting-gas jetting orifices (10B) are formed into a ring shape that adjacently surrounds a corresponding one of the source-gas jetting orifices (10A).

8 Claims, 5 Drawing Sheets

U.S. PATENT DOCUMENTS

| | | | |
|---|---|---|---|
| 6,428,850 B1* | 8/2002 | Shinriki et al. | 427/255.32 |
| 6,663,715 B1* | 12/2003 | Yuda et al. | 118/723 R |
| 6,800,139 B1* | 10/2004 | Shinriki et al. | 118/715 |
| 6,884,296 B2* | 4/2005 | Basceri et al. | 118/715 |
| 7,105,060 B2* | 9/2006 | Shimogaki et al. | 118/715 |
| 7,481,886 B2* | 1/2009 | Kato et al. | 118/715 |
| 7,709,398 B2* | 5/2010 | Strauch et al. | 438/758 |
| 2004/0029379 A1* | 2/2004 | Yamasaki et al. | 438/685 |
| 2004/0050328 A1* | 3/2004 | Kumagai et al. | 118/715 |
| 2004/0149212 A1* | 8/2004 | Cho et al. | 118/715 |
| 2005/0092248 A1* | 5/2005 | Lee et al. | 118/715 |
| 2005/0155551 A1* | 7/2005 | Bae et al. | 118/715 |
| 2005/0158469 A1* | 7/2005 | Park et al. | 427/255.23 |
| 2005/0229848 A1* | 10/2005 | Shinriki et al. | 118/715 |
| 2005/0233093 A1* | 10/2005 | Tada et al. | 427/569 |
| 2006/0021703 A1* | 2/2006 | Umotoy et al. | 156/345.34 |
| 2006/0127600 A1* | 6/2006 | Kumagai et al. | 427/569 |
| 2007/0272154 A1* | 11/2007 | Amikura et al. | 118/719 |

FOREIGN PATENT DOCUMENTS

| | | |
|---|---|---|
| JP | 03-122281 | 5/1991 |
| JP | 10-321613 | 12/1998 |
| JP | 2000-144432 | 5/2000 |

OTHER PUBLICATIONS

Translation of International Preliminary Report on Patentability (Form PCT/IPEA/409), in connection with PCT/JP2004/015716, dated Jan. 2004.

* cited by examiner

SHOWER HEAD AND FILM-FORMING DEVICE USING THE SAME

TECHNICAL FIELD

The present invention relates to a showerhead for use in supplying a gas into a processing vessel to deposit a film on a surface of an object to be processed such as a semiconductor wafer, and to a film deposition apparatus using such a showerhead.

BACKGROUND ART

In manufacturing a semiconductor integrated circuit, an object to be processed such as a semiconductor wafer is generally, repeatedly subjected to various single-wafer processes, such as a film deposition process, etching process, heat process, modification process, and crystallization process, so as to form a desired integrated circuit. In order to perform these processes, a process gas fit for the kind of process in question is supplied into a processing vessel. In a film deposition process, a source gas and a supporting gas, such as an oxidation gas and a reduction gas, are supplied into a processing vessel capable of forming a vacuum, from a showerhead disposed on a top part of the processing vessel. Thus, a film is deposited on a surface of a semiconductor wafer or the like heated in the processing vessel (JP 10-321613A).

If a source gas with a relatively low steam pressure and a relatively high activation energy is mixed with a supporting gas while the source gas is being fed, a film deposition reaction undesirably occurs. Thus, in order to prevent this reaction, there has been employed a jetting system in which the source gas does not contact the supporting gas until the source gas is jetted into the processing vessel from the showerhead. This jetting system is referred to as a "post-mix type". In the post-mix type, the source gas and the supporting gas flow through separate channels in the showerhead, such that the gases are not mixed with each other. Due to this structure, deposition of an unwanted film, which results in formation of particles or the like, is prevented in the showerhead, and a required film can be mainly deposited only on a wafer surface.

However, in the course of repeatedly performing a film deposition process on the wafer, there has been a case in which an unwanted film ranging from several millimeters to several centimeters in diameter is deposited around source-gas jetting orifices, which are formed in a gas jetting surface of the showerhead facing the processing vessel. If such an unwanted film adhered to the gas jetting surface is left as it is, the film is peeled off from the gas jetting surface, thus causing formation of particles. Thus, it has been necessary to frequently carry out a cleaning process for removing the unwanted film. In this case, when it is possible to perform a so-called dry cleaning process that removes the unwanted film by passing a cleaning gas through the showerhead without detaching the same, only few problems arise. However, when an organic metal material gas containing certain kinds of high melting point metals, such as Hf (hafnium), is used as a material, there exists no effective cleaning gas. Thus, it is necessary to perform a so-called wet cleaning process that cleans the showerhead, while it is detached from a film-deposition apparatus body, by means of a cleaning solution. This is disadvantageous in that a lot of time is needed for a maintenance operation.

DISCLOSURE OF INVENTION

Taking account of this disadvantage, the present invention has been made to effectively solve the same. The object of the present invention is to provide a showerhead that is capable of preventing deposition of an unwanted film around source-gas jetting orifices in a gas jetting surface, and a film deposition apparatus using the same showerhead.

In order to achieve this object, the present invention provides a showerhead that supplies a source gas and a supporting gas into a vacuum atmosphere in a processing vessel, so as to deposit a film on a surface of an object to be processed in the processing vessel, comprising:

a showerhead body provided with a gas jetting surface facing an inside of the processing vessel;

a first diffusion chamber formed in the showerhead body to receive the source gas and diffuse the same;

a second diffusion chamber formed in the showerhead body to receive the supporting gas and diffuse the same;

a plurality of source-gas jetting orifices formed in the gas jetting surface to be communicated with the first diffusion chamber; and a plurality of first supporting-gas getting orifices formed in the gas jetting surface to be communicated with the second diffusion chamber, wherein each of the first supporting-gas jetting orifices is formed into a ring shape that adjacently surrounds a corresponding one of the source-gas jetting orifices.

In addition, the present invention provides a showerhead that supplies a source gas and a supporting gas into a vacuum atmosphere in a processing vessel, so as to deposit a film on a surface of an object to be processed in the processing vessel, comprising:

a showerhead body provided with a gas jetting surface facing an inside of the processing vessel;

a first diffusion chamber formed in the showerhead body to receive the source gas and diffuse the same;

a second diffusion chamber formed in the showerhead body to receive the supporting gas and diffuse the same;

a plurality of source-gas jetting orifices formed in the gas jetting surface to be communicated with the first diffusion chamber; and a plurality of first supporting-gas getting orifices formed in the gas jetting surface to be communicated with the second diffusion chamber, wherein each of the source-gas jetting orifices is adjacently surrounded by at least two of the first supporting-gas jetting orifices.

According to these showerheads, the source gas which has been just jetted from the source-gas jetting orifices into the processing vessel flows downward, with the jetted source gas temporarily surrounded by the supporting gas jetted from the first supporting-gas jetting orifices. This prevents the activated source gas from stagnating near the source-gas jetting orifices. Thus, deposition of an unwanted film on the gas jetting surface around the source-gas jetting orifices can be avoided. Therefore, an interval between cleaning processes can be elongated to thereby decrease a frequency of the cleaning processes. Owing thereto, an availability factor of the apparatus can be enhanced.

The showerhead according to the present invention preferably further comprises a plurality of second supporting-gas jetting orifices formed in the gas jetting surface to be communicated with the second diffusion chamber, each of the second supporting-gas jetting orifices being arranged between adjacent two of the source-gas jetting orifices.

For example, the source gas is a gas containing a high melting point metal, specifically, an organic metal material gas containing a high melting point metal.

The present invention provides a film deposition apparatus that deposits a film on a surface of an object to be processed, by using a source gas and a supporting gas, comprising: a processing vessel; an evacuation system that evacuates an inside of the processing vessel to form therein a vacuum; a table provided in the processing vessel to dispose thereon the object to be processed; a heater that heats the object to be processed disposed on the table; and the aforesaid showerhead provided on a top part of the processing vessel.

BEST MODE FOR CARRYING OUT THE INVENTION

Embodiments of a showerhead and a film deposition apparatus using the same according to the present invention will be described in detail below, with reference to the accompanying drawings.

First Embodiment

With reference to FIGS. 1 to 4, a first embodiment of the present invention is described.

Figure 1:
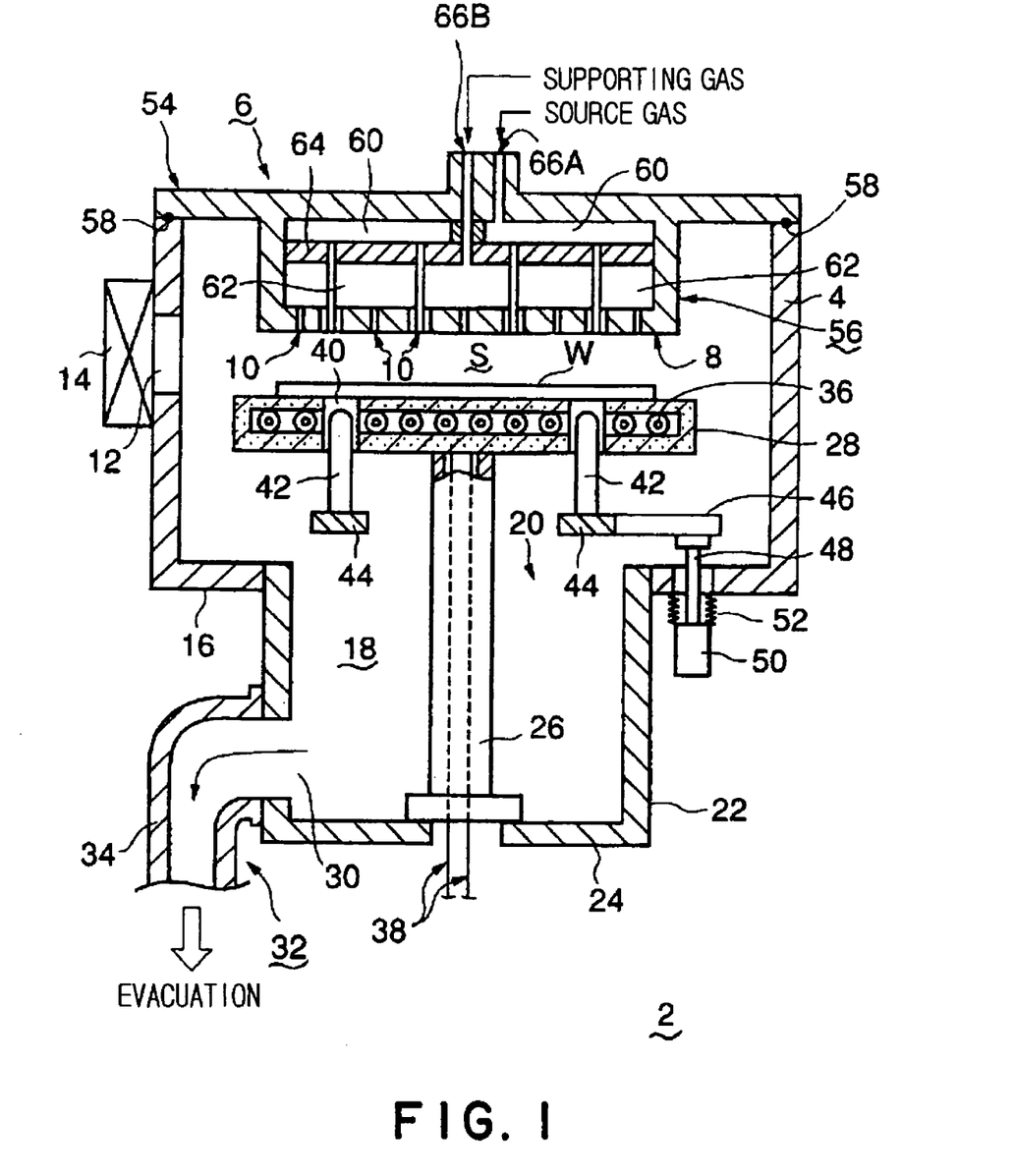
FIG. 1 is a sectional view showing a structure of a film deposition apparatus in a first embodiment of the present invention.

A film deposition apparatus 2 shown in FIG. 1 includes a cylindrical processing vessel 4 made of, e.g., aluminum. A showerhead 6 that supplies a source gas and a supporting gas for depositing a film is provided on a top part in the processing vessel 4. The showerhead 6 is adapted to jet the gases toward a processing space S in the processing vessel 4 through a plurality of gas jetting orifices 10 formed in a gas jetting surface 8. Details of the showerhead 6 is described hereafter.

A loading/unloading port 12 is formed in a sidewall of the processing vessel 4, through which a semiconductor wafer W as an object to be processed is loaded into the processing vessel 4 and unloaded therefrom. A gate vale 14 capable of being hermetically opened and closed is disposed on the loading/unloading port 12.

An evacuation chamber 18 is formed below the processing vessel 4. The evacuation chamber 18 is defined by a cylindrical sidewall 22 and a bottom wall 24, and is in communication with an inside of the processing vessel 4 through an opening 20 formed in a center of a bottom part 16 of the processing vessel 4. A cylindrical pole 26 made of quartz glass or the like extends upwardly from the bottom wall 24 to the inside of the processing vessel 4. A table 28 is secured on an upper end of the pole 26 by welding. The pole 26 and the table 28 may be made of ceramics such as AlN.

The opening 20 in the bottom part 16 of the processing vessel 4 has a diameter smaller than that of the table 28. A process gas flows downward around a periphery of the table 28 and passes under the same to flow into the opening 20. An evacuation port 30 is formed in a lower part of the sidewall 22, to which an evacuation pipe 34 of a vacuum evacuation system 32 is connected. The vacuum evacuation system 32 is provided with a vacuum pump, not shown, arranged on the evacuation pipe 34, whereby atmospheres in the processing vessel 4 and the evacuation chamber 18 can be evacuated to form therein a vacuum via the evacuation pipe 34. In addition, the vacuum evacuation system 32 is provided with a pressure adjusting valve, not shown, arranged in the evacuation pipe 34. By adjusting an opening degree of the pressure adjusting valve, a pressure in the processing vessel 4 can be maintained at a certain value, and the pressure can rapidly be changed to a desired one.

A resistance heater 36 of a carbon wire, for example, is buried in the table 28. The semiconductor wafer (object to be processed) W disposed on an upper surface of the table 28 can be head by the heater 36. A controlled electric power can be supplied to the heater 36 through a feeder 38 arranged in the pole 26.

The table 28 is provided with a plurality of (e.g., three) pin through-holes 40 passing vertically therethrough (two pin through-holes 40 are shown in FIG. 1). A lifting pin 42 is inserted through each of the pin through-holes 40 in a vertically movable manner. A lower end of each of the lifting pins 42 is supported in a non-stationary manner by a lifting ring 44 made of ceramics such as alumina. An arm member 46 extending from the lifting ring 44 is connected to a retractable rod 48 passing through the bottom part 16 of the processing vessel 4. The retractable rod 48 can be vertically moved by an actuator 50. Thus, when the wafer W is delivered, the respective lifting pins 42 can be raised from the pin through-holes 40 and received therein. An elongatable bellows 52 is disposed such that the retractable rod 48 can be vertically moved, while maintaining an airtightness in the processing vessel 4.

The showerhead 6 is described in detail.

The showerhead 6 includes a hollow cylindrical showerhead body 56. The showerhead body 56 is joined to a lower surface of a top plate 54 that closes an upper end of the processing vessel 4. A sealing member 58, such as an O-ring for maintaining an airtightness in the processing vessel 4, is interposed between a peripheral part of the top plate 54 and the upper end of the processing vessel 4. The showerhead 6 is formed of, for example, nickel, a nickel alloy such as HAS-TELLOY (registered trademark), aluminum, and an aluminum alloy.

In the showerhead body 56, there are separately defined a first diffusion chamber 60 that receives a source gas and diffuses the same, and a second diffusion chamber 62 that receives a supporting gas and diffuses the same. In the drawings, the upper first diffusion chamber 60 and the lower second diffusion chamber 62 are separated in a vertical direction by a partition plate 64 positioned horizontally in the showerhead body 56. The first diffusion chamber 60 is communicated with a source-gas inlet port 66A which is formed in the top plate 54 to supply a source gas into the first diffusion chamber 60. The second diffusion chamber 62 is communicated with a supporting-gas inlet port 66B which is formed in the top plate 54 to supply a supporting gas into the second diffusion chamber 62.

Figure 2:
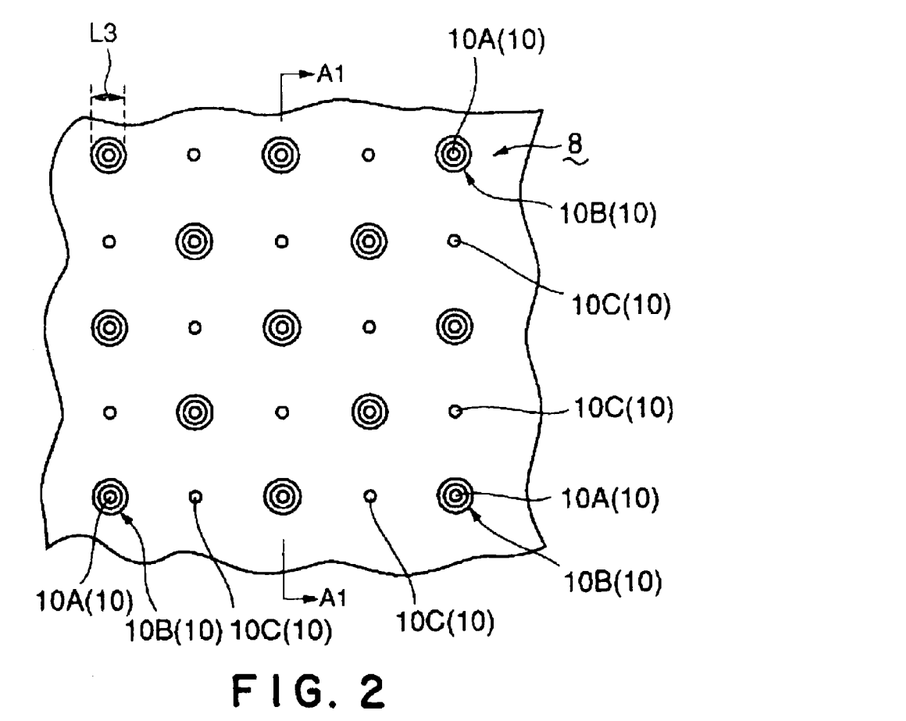
FIG. 2 is a plan view showing a part of a gas jetting surface of the showerhead shown in FIG. 1.

As shown in FIG. 2, a plurality of gas jetting orifices 10 are arranged in the form of a lattice in a gas jetting surface 8 which is a lower surface of the showerhead body 56. To be specific, the gas jetting orifices 10 include source-gas jetting orifices 10A for jetting a source gas, first supporting-gas jetting orifices 10B for jetting a supporting gas, and second supporting-gas jetting orifices 10C for jetting a supporting gas. Each of the first supporting-gas orifices 10B is formed into a ring shape that adjacently surrounds a corresponding one of the source-gas jetting orifices 10A. Each of the second supporting-gas jetting orifices 10C is arranged at an intermediate position between adjacent two of the source-gas jetting orifices 10A (and the corresponding first supporting-gas jetting orifices 10B). The second supporting-gas jetting orifices 10C may be omitted, if a supply amount of a supporting gas jetted from the first supporting-gas jetting orifices 10B is sufficient, or a density per unit area of the source-gas jetting orifices 10A reaches a certain degree.

Figure 3:
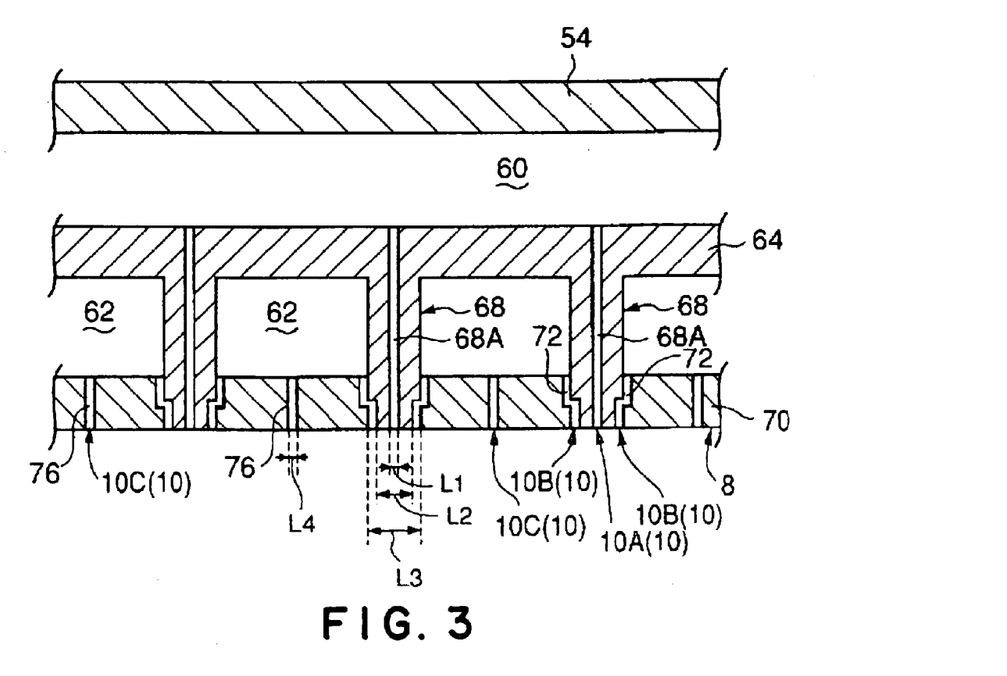
FIG. 3 is a sectional view taken along the line A1-A1 in FIG. 2.

As shown in FIG. 3, the source-gas jetting orifices 10A are communicated with the first diffusion chamber 60 through gas channels 68A formed in nozzles 68 extending downward from the partition plate 64. A distal end of each nozzle 68 has a reduced diameter to form a step. The first supporting-gas jetting orifices 10B are communicated with the second diffusion chamber 62 through gas channels 72 passing through a bottom plate 70 of the showerhead body 56.

Figure 4:
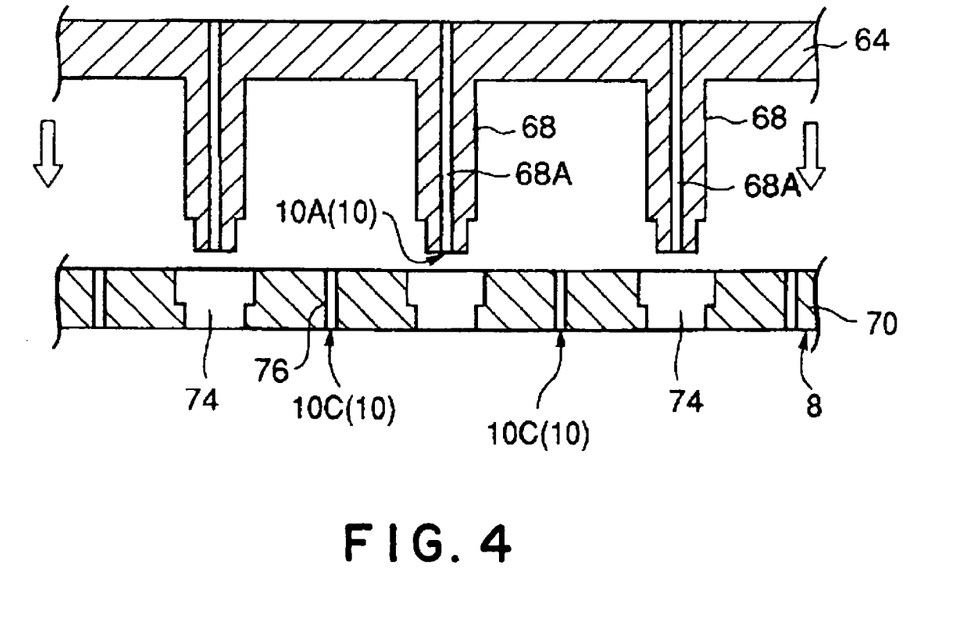
FIG. 4 is a view showing a part of an assembling step of the showerhead shown in FIG. 3.

Fabrication of such a structure is described referring to FIG. 4. At first, stepped openings 74 whose dimensions are somewhat larger than those of the distal ends of the nozzles 68 are formed in the bottom plate 70 at positions corresponding to the respective nozzles 68. Then, the partition plate 64 and the bottom plate 70 are joined and secured to each other, such that each of the distal end of the nozzle 68 is received in the corresponding opening 74 so as not to contact each other. The second supporting-gas jetting orifices 10C are communicated with the second diffusion chamber 62 through gas channels 76 passing through the bottom plate 70.

For example, in the showerhead 6 for use with a 300 mm wafer, the number of source-gas jetting orifices 10A is about 300 to 400. Sizes of each of the gas jetting orifices 10 are as follows: an inner diameter L1 (FIG. 3) of the source-gas jetting orifice 10A is about 1 mm; an inner diameter L2 (FIG. 3) and an outer diameter L3 (FIGS. 2 and 3) of the first supporting-gas jetting orifice 10B are about 2 mm and about 2.4 mm, respectively; and an inner diameter L4 (FIG. 3) of the second supporting-gas jetting orifice 10C is about 0.5 mm.

Next, an operation of the film deposition apparatus as constituted above is described.

A source gas and a supporting gas are used as process gases. Given herein as an example to describe the process is a case where an organic metal material gas containing Hf (hafnium) is used as a source gas, while $O_2$ gas is used as a supporting gas, so as to deposit a film of Hf oxide ($HfO_2$). The organic metal material gas is manufactured by dissolving an organic metal material which is liquid or solid at room temperature in a solvent (octane, for example), and by vaporizing the dissolved material by a vaporizer.

At first, an unprocessed semiconductor wafer W is loaded into the processing vessel 4 by a conveying arm, not shown, through the loading/unloading port 12 which has been opened by the gate valve 14. The loaded wafer W is then delivered to the raised lifting pins 42. Thereafter, the lifting pins 42 are lowered, so that the wafer W is disposed on the upper surface of the table 28.

Following thereto, an organic metal material gas as a source gas and $O_2$ gas as a supporting gas are supplied into the showerhead 6, with their flow rates being controlled. These gases are jetted toward the processing space S through the gas jetting orifices 10A to 10C in the showerhead 6. At the same time, in the evacuation system 32, an opening degree of the pressure adjusting valve is adjusted, while driving the vacuum pump, so as to maintain an atmosphere in the processing space S at a predetermined process pressure. Meanwhile, the wafer W is heated by the heater 36 buried in the table 28, and is maintained at a predetermined process temperature.

At this time, since the organic metal material gas is highly activated, the organic metal material gas is decomposed for a relatively a short period of time, after it is supplied into the processing space S. The organic metal material itself contains oxygen atoms. Thus, the contained oxygen atoms and Hf atoms are mainly combined with each other, so that an $HfO_2$ film is deposited on a surface of the wafer W by CVD (chemical vapor deposition). The $O_2$ gas as a supporting gas supports such a reaction.

In a conventional showerhead, each source-gas jetting orifice is spaced apart from the adjacent supporting-gas jetting orifice by more than 10 mm. Thus, the organic metal material gas, which has been thermally decomposed and activated, stagnates directly below a gas jetting surface at positions near the source-gas jetting orifices, for a certain period of time. Thus, as described above, the problem has arisen that an unwanted adhesion film ($HfO_2$) is deposited on the gas jetting surface at positions around the source-gas jetting orifices.

On the other hand, in the showerhead 6 of the present invention, each first supporting-gas jetting orifice 10B is formed to surround a circumference of the corresponding source-gas jetting orifice 10A. Thus, the organic metal material gas containing Hf, that has been discharged downward from the source-gas jetting orifices 10A, flows toward a lower part of the processing space S, with the organic metal material gas temporarily surrounded by the $O_2$ gas, that has been discharged downward from the first supporting-gas jetting orifices 10B. Thus, when the source gas discharged toward the processing space S is activated and decomposed, active species and Hf atoms are prevented from contacting the gas jetting surface 8. As a result, deposition of an unwanted adhesion film ($HfO_2$) on the gas jetting surface 8 can be avoided. This avoidance of deposition of an unwanted film can decrease a frequency of maintenance for cleaning the film deposition apparatus, to thereby improve an availability factor of the apparatus.

In this embodiment, each second supporting-gas jetting orifice 10C is disposed between the adjacent source-gas jetting orifices 10A, so that $O_2$ gas as a supporting gas is also jetted from the second supporting-gas jetting orifices 10C. This constitution can also inhibit deposition of an unwanted adhesion film ($HfO_2$) on the gas jetting surface 8. Here, an operation of the supporting gas is to restrain a rapid activation of the source gas that has jetted to the processing space S.

For example, in the showerhead 6 for use with a wafer size of 300 mm, the number of the source-gas jetting orifices 10A is about 340, and a total area thereof is about 267 $mm^2$. A total area of the first supporting-gas jetting orifices 10B is about 470 $mm^2$. The number of the second supporting-gas jetting orifices 10C is about 340, and a total area thereof is about 70 $mm^2$. A gap of the processing space S (distance between the gas jetting surface 8 and the upper surface of the table 28) is about 40 mm. A distance between the adjacent source-gas jetting orifices 10A is about 17 mm. Other factors are, for example, an about 1500 sccm flow rate of the source gas, an about 1500 sccm flow rate of oxygen, an about 40 Pa process pressure, and an about 500° C. process temperature.

Figure 5:
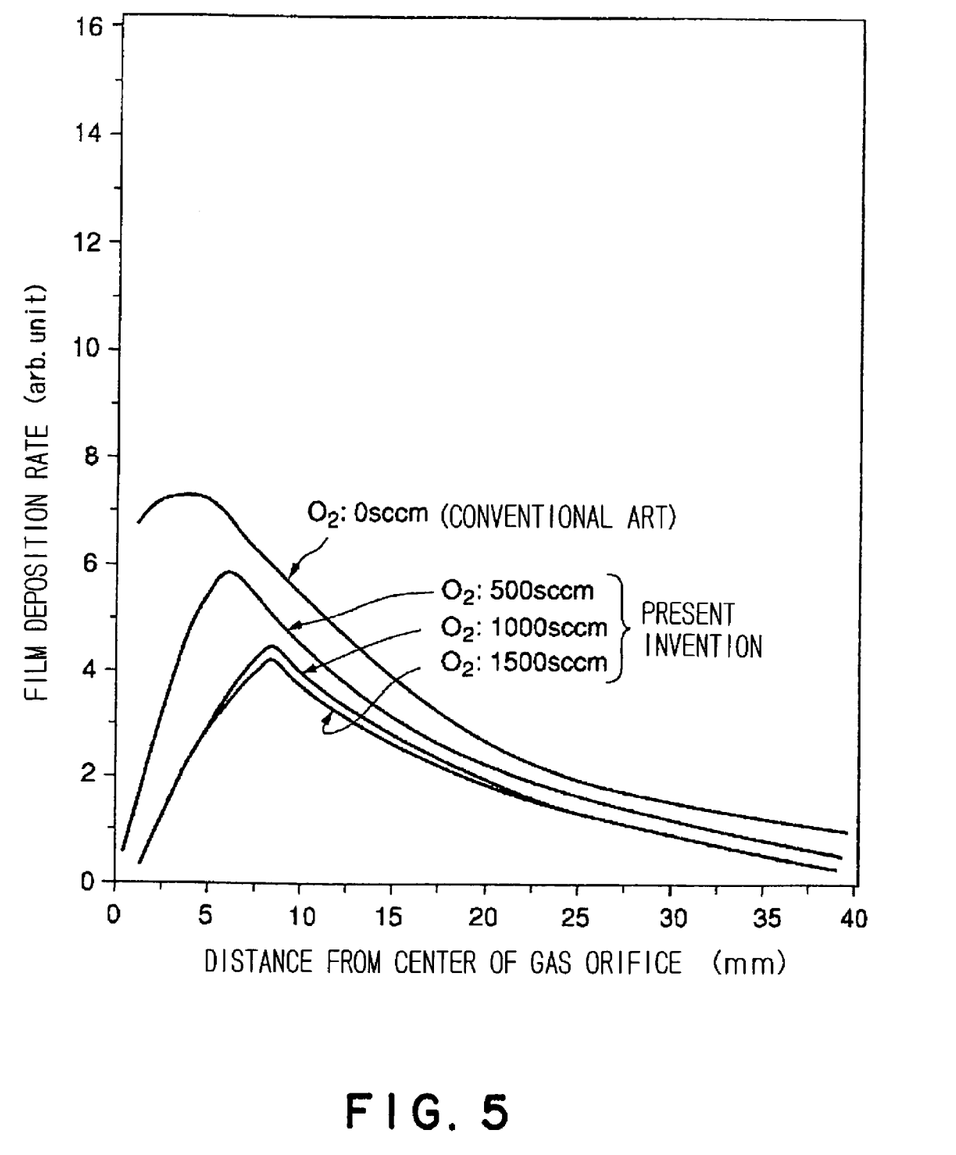
FIG. 5 is a graph showing a relationship between a distance from a center of a gas jetting orifice and a film deposition rate on a surface of the showerhead.

A relationship between a flow rate of $O_2$ gas as a supporting gas and a deposition rate of an unwanted film adhered to the gas jetting surface of the showerhead was evaluated by a simulation. The evaluation result is described referring to FIG. 5. FIG. 5 is a graph showing a relationship between a distance from a center of the gas jetting orifice and a film deposition rate on a surface of the showerhead. In FIG. 5, the distance 0 mm in the axis of abscissas shows a center position of a certain source-gas jetting orifice 10A, while the axis of ordinates shows an arbitrary unit (arb. unit). A flow rate of the $O_2$ gas changes from 0 sccm to 1500 sccm.

As apparent from FIG. 5, in the conventional showerhead ($O_2$: 0 sccm), a film deposition rate of the gas jetting surface was relatively high in a range between the center of the gas jetting orifice and a position away therefrom by about 10 mm. The film deposition rate of the gas jetting surface gradually decreased, as the position further receded away from the center of the source-gas jetting orifice. Actually, after some wafers were subjected to a film deposition process, deposition of an unwanted film having a diameter of some centimeters was visually observed around the source-gas jetting orifice.

On the other hand, in the showerhead 6 of the present invention, in accordance with a stepwise increase in supply amount of $O_2$ gas from 500 sccm to 1500 sccm, peak values of the film deposition rate of the gas jetting surface considerably decreased in this order. It is understood that the decrease in the film deposition rate was substantially saturated, with a flow rate of the $O_2$ gas which is between 1000 sccm and 1500 sccm.

Second Embodiment

A second embodiment of the present invention is described with reference to FIGS. 6 and 7.

Figure 6:
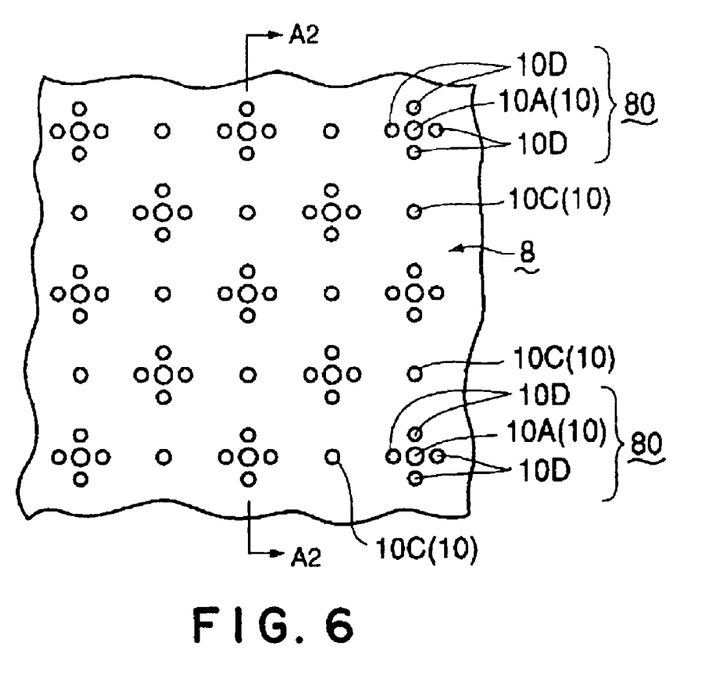
FIG. 6 is a plan view showing a part of a gas jetting surface of the showerhead in a second embodiment of the present invention.
Figure 7:
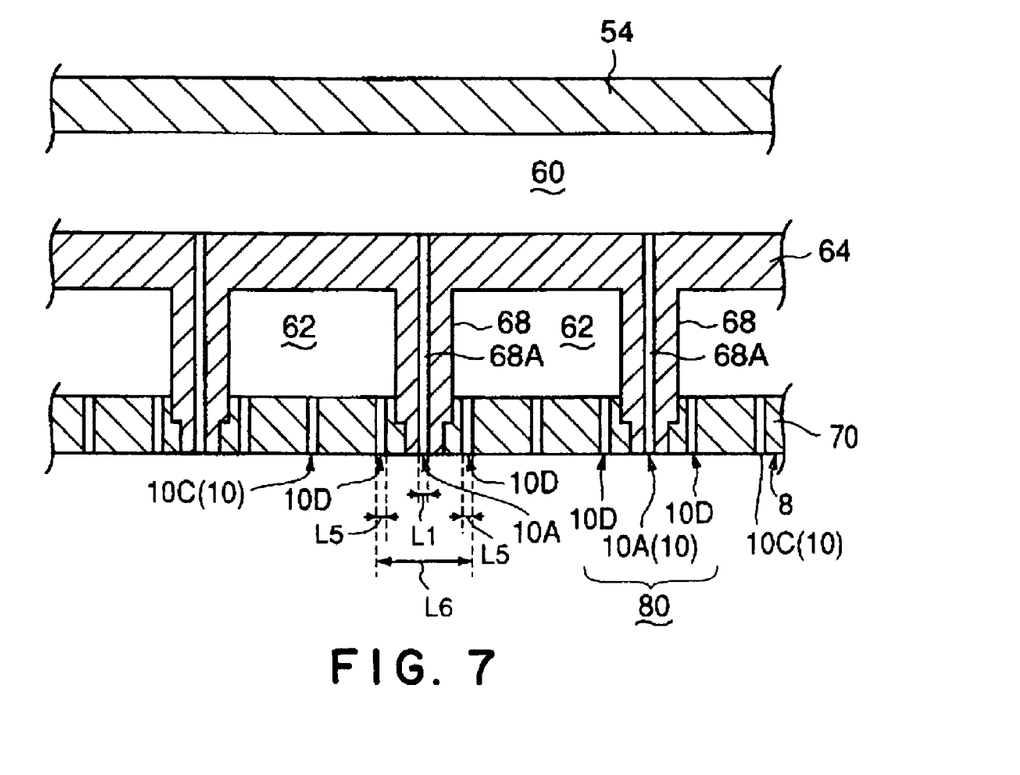
FIG. 7 is a sectional view taken along the line A2-A2 in FIG. 6.

As shown in FIGS. 6 and 7 illustrating this embodiment, instead of the first supporting-gas jetting orifices 10B of a ring shape, a plurality of first supporting-gas jetting orifices 10D each having a circular shape are formed to adjacently surround respective source-gas jetting orifices 10A.

In an example shown in FIG. 6, four first supporting-gas jetting orifices 10D are arranged around one source-gas jetting orifice 10A at 90° intervals about the orifice 10A. A combination of one source-gas jetting orifice 10A and four first supporting-gas jetting orifices 10D forms a jetting orifice unit 80. Although the number of the first supporting-gas jetting orifices 10D relative to one source-gas jetting orifice 10A is not limited to four, it is preferable that two or more first supporting-gas jetting orifices 10D are arranged at equally spaced intervals, in order to surround a source gas jetted from the source-gas jetting orifice 10A by a supporting gas. For example, an inner diameter L5 (FIG. 7) of the first supporting-gas jetting orifice 10D is about 0.5 mm, and a distance (outer size) L6 (FIG. 7) between adjacent first supporting-gas jetting orifices 10D, which are opposed to each other across the source-gas jetting orifice 10A, is about 5.5 mm.

There are arranged second supporting-gas jetting orifices 10C, each of which is arranged on an intermediate position between the adjacent jetting orifice units 80. Similar to the first embodiment, the second supporting-gas jetting orifices 10C may be omitted.

Again in the second embodiment, since a source gas jetted from each source-gas jetting orifice 10A is surrounded by a supporting gas jetted from the plurality of first supporting-gas jetting orifices 10D, deposition of an unwanted adhesion film on a gas jetting surface 8 can be avoided, which is similar to the first embodiment.

In the respective embodiments, $O_2$ gas is used as a supporting gas. However, not limited thereto, an inert gas such as $N_2$ gas, He gas, and Ar gas can be used.

Besides, although an organic metal material gas containing Hf, which is a high melting point metal, is used as a source gas, the present invention can be applied in a process using a given source gas, as far as the gas shows a tendency of depositing an unwanted adhesion film on a gas jetting surface of a showerhead. Thus, the source gas may be, for example, an organic metal material gas containing a high melting point metal other than Hf, such as W (tungsten), Ti (titanium), and Ta (tantalum), or an organic metal material gas containing no high melting point metal. Alternatively, a gas other than an organic metal material gas may be used.

A resistance heater is taken as an example of heating means in a film deposition apparatus. However, in place thereof, a heating lamp can be used.

Not limited to a semiconductor wafer, the present invention can be applied to a process in which an object to be processed is an LCD substrate, a glass substrate, and so on.

The invention claimed is:

1. A showerhead that supplies a source gas and a supporting gas into a vacuum atmosphere in a processing vessel, so as to deposit a film on a surface of an object to be processed in the processing vessel, comprising:
    a showerhead body provided with a gas jetting surface facing an inside of the processing vessel;
    a first diffusion chamber formed in the showerhead body to receive the source gas and diffuse the same;
    a second diffusion chamber formed in the showerhead body to receive the supporting gas and diffuse the same;
    a plurality of source-gas jetting orifices formed in the gas jetting surface to be communicated with the first diffusion chamber;
    a plurality of first supporting-gas jetting orifices formed in the gas jetting surface to be communicated with the second diffusion chamber; and
    a plurality of second supporting-gas jetting orifices formed in the gas jetting surface to be communicated with the second diffusion chamber,
    wherein each of the first supporting-gas jetting orifices has a ring shape that adjacently surrounds a corresponding one of the source-gas jetting orifices, and each of the source-gas jetting orifices is positioned inside the ring of the first supporting-gas jetting orifice, and
    each of the second supporting-gas jetting orifices is arranged between adjacent two of the source-gas jetting orifices.

2. The showerhead according to claim 1, wherein the source gas contains a high melting point metal.

3. The showerhead according to claim 2, wherein the source gas is an organic metal material gas.

4. A showerhead that supplies a source gas and a supporting gas into a vacuum atmosphere in a processing vessel, so as to deposit a film on a surface of an object to be processed in the processing vessel, comprising:
    a showerhead body provided with a gas jetting surface facing an inside of the processing vessel;
    a first diffusion chamber formed in the showerhead body to receive the source gas and diffuse the same;
    a second diffusion chamber formed in the showerhead body to receive the supporting gas and diffuse the same;
    a plurality of source-gas jetting orifices formed in the gas jetting surface to be communicated with the first diffusion chamber; and
    a plurality of first supporting-gas jetting orifices formed in the gas jetting surface to be communicated with the second diffusion chamber, and
    a plurality of second supporting-gas jetting orifices formed in the gas jetting surface to be communicated with the second diffusion chamber;
    wherein each of the source-gas jetting orifices is adjacently surrounded by at least four of the first supporting-gas jetting orifices so that the at least four of the first supporting-gas jetting orifices are arranged around the corresponding source-gas jetting orifice at equally spaced intervals about the corresponding source-gas jetting orifice, a combination of the corresponding source-gas jetting orifice and the at least four of the first supporting-gas jetting orifices forms a jetting orifice unit, and each of the second supporting-gas jetting orifices is arranged between adjacent two of the jetting orifice units.

5. The showerhead according to claim 4, wherein the source gas contains a high melting point metal.

6. The showerhead according to claim 5, wherein the source gas is an organic metal material gas.

7. A film deposition apparatus that deposits a film on a surface of an object to be processed, by using a source gas and a supporting gas, comprising:

a processing vessel;

an evacuation system that evacuates an inside of the processing vessel to form therein a vacuum;

a table provided in the processing vessel to dispose thereon the object;

a heater that heats the object disposed on the table; and a showerhead provided on a top part of the processing vessel; the showerhead including:

a showerhead body provided with a gas jetting surface facing an inside of the processing vessel;

a first diffusion chamber formed in the showerhead body to receive the source gas and diffuse the same;

a second diffusion chamber formed in the showerhead body to receive the supporting gas and diffuse the same;

a plurality of source-gas jetting orifices formed in the gas jetting surface to be communicated with the first diffusion chamber;

a plurality of first supporting-gas jetting orifices formed in the gas jetting surface to be communicated with the second diffusion chamber; and a plurality of second supporting-gas jetting orifices formed in the gas jetting surface to be communicated with the second diffusion chamber, wherein each of the first supporting-gas jetting orifices has a ring shape that adjacently surrounds a corresponding one of the source-gas jetting orifices, and each of the source-gas jetting orifices is positioned inside the ring of the first supporting-gas jetting orifice, and each of the second supporting-gas jetting orifices is arranged between adjacent two of the source-gas jetting orifices.

8. A film deposition apparatus that deposits a film on a surface of an object to be processed, by using a source gas and a supporting gas, comprising:

a processing vessel;

an evacuation system that evacuates an inside of the processing vessel to form therein a vacuum;

a table provided in the processing vessel to dispose thereon the object;

a heater that heats the object disposed on the table; and a showerhead provided on a top part of the processing vessel; the showerhead including:

a showerhead body provided with a gas jetting surface facing an inside of the processing vessel;

a first diffusion chamber formed in the showerhead body to receive the source gas and diffuse the same;

a second diffusion chamber formed in the showerhead body to receive the supporting gas and diffuse the same;

a plurality of source-gas jetting orifices formed in the gas jetting surface to be communicated with the first diffusion chamber; and a plurality of first supporting-gas jetting orifices formed in the gas jetting surface to be communicated with the second diffusion chamber, and a plurality of second supporting-gas jetting orifices formed in the gas jetting surface to be communicated with the second diffusion chamber;

wherein each of the source-gas jetting orifices is adjacently surrounded by at least four of the first supporting-gas jetting orifices so that the at least four of the first supporting-gas jetting orifices are arranged around the corresponding source-gas jetting orifice at equally spaced intervals about the corresponding source-gas jetting orifice, a combination of the corresponding source-gas jetting orifice and the at least four of the first supporting-gas jetting orifices forms a jetting orifice unit, and each of the second supporting-gas jetting orifices is arranged between adjacent two of the jetting orifice units.

* * * * *